(12) United States Patent
Van Elzakker et al.

(10) Patent No.: US 11,846,661 B2
(45) Date of Patent: Dec. 19, 2023

(54) CIRCUIT AND METHOD FOR DETERMINING THE RATIO BETWEEN TWO FREQUENCIES

(71) Applicant: SEMIBLOCKS B.V., 's-Hertogenbosch (NL)

(72) Inventors: Michiel Van Elzakker, Eindhoven (NL); Rob Van Der Valk, Capelle aan de IJssel (NL); Kees Van Nieuwburg, 's-Hertogenbosch (NL)

(73) Assignee: SEMIBLOCKS B.V., 'S-Hertogenbosch (NL)

( * ) Notice: Subject to any disclaimer, the term of this patent is extended or adjusted under 35 U.S.C. 154(b) by 321 days.

(21) Appl. No.: 17/434,641

(22) PCT Filed: Feb. 24, 2020

(86) PCT No.: PCT/NL2020/050118
§ 371 (c)(1),
(2) Date: Aug. 27, 2021

(87) PCT Pub. No.: WO2020/175986
PCT Pub. Date: Sep. 3, 2020

(65) Prior Publication Data
US 2022/0170968 A1 Jun. 2, 2022

(30) Foreign Application Priority Data
Feb. 27, 2019 (NL) .................... 2022646

(51) Int. Cl.
*G01R 23/02* (2006.01)
*G01K 7/32* (2006.01)
*H03L 7/093* (2006.01)

(52) U.S. Cl.
CPC .............. *G01R 23/02* (2013.01); *G01K 7/32* (2013.01); *H03L 7/093* (2013.01)

(58) Field of Classification Search
CPC .......... G01R 23/02; G01K 7/32; H03L 7/093; H03L 7/07; H03L 7/087; H03L 7/0992
See application file for complete search history.

(56) References Cited

U.S. PATENT DOCUMENTS 6,420,938 B1 7/2002 Hoff et al.
7,639,053 B2 * 12/2009 Shen ............... H03L 7/193
327/158

(Continued)

FOREIGN PATENT DOCUMENTS

EP 2602936 B1 2/2014
NL 2022646 B1 9/2020

(Continued)

OTHER PUBLICATIONS

Azcondo et al., "Frequency Correction and Frequency Locked Loop for A Microcomputer Compensated Crystal Oscillator", Proceedings of IECON '93—19th Annual Conference of IEEE Industrial Electronics, IEEE, Nov. 15-19, 1993, pp. 1979-1984.

(Continued)

*Primary Examiner* — Giovanni Astacio-Oquendo
*Assistant Examiner* — Zannatul Ferdous
(74) *Attorney, Agent, or Firm* — AEON Law, PLLC; Adam L. K. Philipp; David Cohen

(57) ABSTRACT

Determining the ratio between two frequencies can be a useful electronic building block in different electronic circuits with very divers functionalities. The invention comprises a circuit for determining a frequency ratio between a first input signal having a first frequency and a second input signal having a second frequency, wherein the circuit comprises: a controlled fractional frequency divider arranged for generating a divided signal having a divided frequency being substantially the first frequency divided by a control signal; a frequency phase detector arranged for generating a phase difference signal based on a frequency phase differ- (Continued)

ence between the divided frequency of the divided signal and the second frequency of the second input signal; and a loop filter arranged for generating the control signal based on the phase difference signal; wherein a loop is formed by the controlled fractional frequency divider, the divided signal, the frequency phase detector, the phase difference signal, the loop filter and the control signal; wherein the loop filter filters the phase difference signal such that instability of the loop is prevented; and wherein the control signal, preferably the magnitude of the control signal, is indicative of the frequency ratio.

19 Claims, 8 Drawing Sheets

(56) References Cited

U.S. PATENT DOCUMENTS

| | | | |
|---|---|---|---|
| 8,384,452 B1 | 2/2013 | Parker et al. | |
| 8,384,453 B1 | 2/2013 | Caviglia et al. | |
| 8,570,112 B2 | 10/2013 | Yamakawa et al. | |
| 9,041,478 B2 | 5/2015 | Montagne | |
| 9,608,649 B2 | 3/2017 | Ek | |
| 2008/0094145 A1* | 4/2008 | Kuan | H03L 7/081 331/11 |
| 2009/0190707 A1 | 7/2009 | Clovis | |
| 2011/0175652 A1* | 7/2011 | Kuo | H03L 7/1976 327/148 |
| 2013/0076415 A1 | 3/2013 | Hara et al. | |
| 2014/0152354 A1 | 6/2014 | McLeod et al. | |
| 2014/0312980 A1 | 10/2014 | Villard et al. | |
| 2022/0038081 A1 | 2/2022 | Elzakker et al. | |

FOREIGN PATENT DOCUMENTS

| | | |
|---|---|---|
| NL | 2022647 B1 | 9/2020 |
| WO | 2013066161 A1 | 5/2013 |
| WO | 2020175986 A1 | 9/2020 |
| WO | 2020175987 A1 | 9/2020 |
| WO | 2020175988 A1 | 9/2020 |

OTHER PUBLICATIONS

International Search Report and Written Opinion, International Application No. PCT/NL2020/050119, dated Jun. 30, 2020, 11 pages.

International Search Report and Written Opinion, International Application No. PCT/NL2020/050120, dated Jun. 30, 2020, 11 pages.

International Search Report and Written Opinion; International Application No. PCT/NL2020/050118, dated May 20, 2020, 11 pages.

Li et al., "A Novel Microcomputer Temperature-Compensating Method for An Overtone Crystal Oscillator", IEEE Transactions on Ultrasonics Ferroelectrics and Frequency Control, vol. 52, No. 11, Nov. 2005, pp. 1919-1922.

* cited by examiner

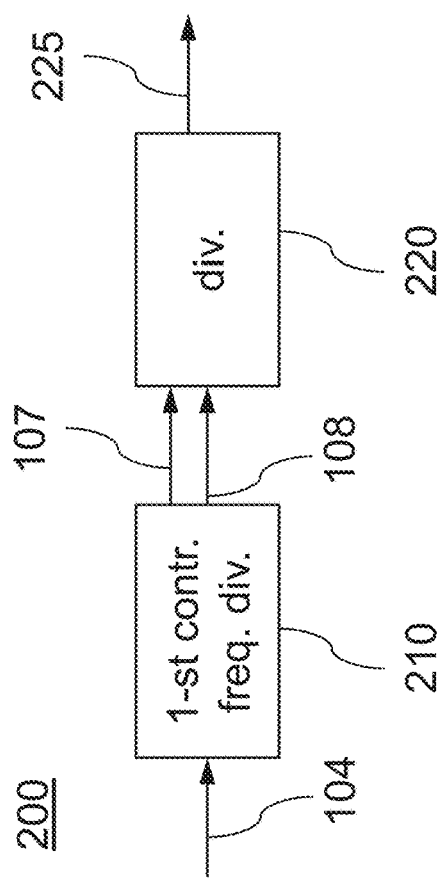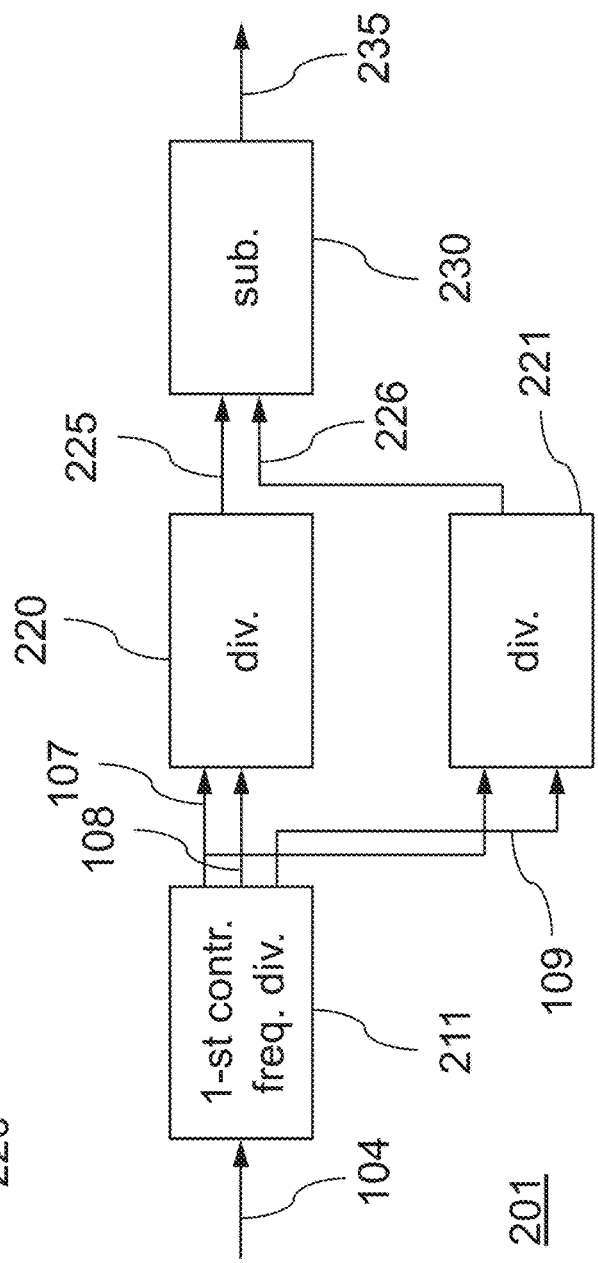

US 11,846,661 B2

CIRCUIT AND METHOD FOR DETERMINING THE RATIO BETWEEN TWO FREQUENCIES

CROSS-REFERENCE TO RELATED APPLICATIONS

This application is a U.S. national phase entry of and claims priority to PCT International Phase Application No. PCT/NL2020/050118, filed Feb. 24, 2020, which claims priority to NL Patent Application No. NL2022646, filed Feb. 27, 2019. The entire contents of the above-referenced applications and of all priority documents referenced in the Application Data Sheet filed herewith are hereby incorporated by reference for all purposes.

FIELD OF THE INVENTION

The invention relates to the field of circuits and methods for determining the ratio between two frequencies.

BACKGROUND OF THE INVENTION

Determining the ratio between two frequencies can be a useful electronic building block in different electronic circuits with very divers functionalities.

A known circuit that determines a ratio of frequencies is known from WO 2013/066161 A1, specifically FIG. 2.

WO 2013/066161 A1 discloses an electronic oscillator circuit, comprising a first oscillator, for supplying a first oscillation signal, a second oscillator, for supplying a second oscillation signal, a first controller for delivering the first control signal as a function of a phase difference between a first controller input and a second controller input of the first controller; a second controller for delivering the second control signal as a function of a phase difference between a first controller input of the second controller and a second controller input of the second controller; a resonator; at least a second resonance frequency, with a first phase shift dependent on the difference between the frequency of a second exciting signal and the second resonance frequency and processing means, for receiving the first oscillator signal and the second oscillator signal, determining their mutual proportion, looking up a frequency compensation factor in a prestored table and outputting a compensated oscillation signal.

In FIG. 2 of WO 2013/066161 A1 the divider setting of the feedback divider determines the ratio between the resonator frequency and the frequency output.

A disadvantage of the circuit in FIG. 2 of WO 2013/066161 A1 is that the frequency output is an output and not an input of the circuit. Furthermore, a disadvantage is that the circuit uses a controlled oscillator, which is a bulky component. Furthermore, the controlled oscillator has the disadvantage of requiring a minimum frequency distance from another controlled oscillator to prevent cross-talk hampering miniaturization and integration.

US 2013/0076415 A1 discloses one or more PLLs formed on an integrated circuit. Each PLL includes an interpolative divider configured as a digitally controlled oscillator, which receives a reference clock signal and supplies an output signal divided according to a divide ratio. A feedback divider is coupled to the output signal of the interpolative divider and supplies a divided output signal as a feedback signal. A phase detector receives the feedback signal and a clock signal to Which the PLL locks. The phase detector supplies a phase error corresponding to a difference between the clock signal and the feedback signal and the divide ratio is adjusted according to the phase error. A disadvantage is the relatively high phase noise on the divided output signal.

SUMMARY OF THE INVENTION

An object of the invention is to overcome one or more of the disadvantages mentioned above.

According to a first aspect of the invention, a circuit for determining a frequency ratio between a first input signal having a first frequency and a second input signal having a second frequency, wherein the circuit comprises:
- a controlled fractional frequency divider arranged for generating a divided signal having a divided frequency being substantially the first frequency divided by a control signal;
- a resonator arranged for being excited by an excitation signal having the divided frequency and is based on the divided signal, and generating the second input signal;
- a frequency phase detector arranged for generating a phase difference signal based on a frequency phase difference between the divided frequency of the divided signal and the second frequency of the second input signal; and
- a loop filter arranged for generating the control signal based on the phase difference signal;

wherein a loop is formed by the controlled fractional frequency divider, the divided signal, the frequency phase detector, the phase difference signal, the loop filter and the control signal;

wherein the loop filter filters the phase difference signal such that instability of the loop is prevented; and wherein the control signal, preferably the magnitude of the control signal, is indicative of the frequency ratio.

The controlled frequency divider may be a digital controlled frequency divider. The controlled frequency divider may be a controlled multiple frequency divider or a controlled fractional frequency divider. The frequency phase detector may be a frequency mixer, analogue multiplier, digital circuit or logic circuit configured as phase detector. Alternatively, the frequency phase detector may be a digital mixer, such as a XOR port mixer.

The first input signal may be any repetitive signal and therefore having a frequency. The first input signal may be a block signal, such as a digital signal. Alternatively, the first input signal may be an analogue signal, such as a triangular signal or sinusoidal signal. The first input signal is typically a signal having a low phase noise. The phase noise may be less than 500 fs, preferably 200 fs, more preferably 100 fs, most preferably 80 fs in a frequency range of 8 kHz to 24 MHz, preferably 10 kHz to 22 MHz, more preferably 12 kHz to 20 MHz, most preferably 14 kHz to 18 MHz.

The controlled frequency divider divides the frequency of the first input signal depending on the control signal. Typically, the control signal is a stabilized signal having a low jitter to prevent the introduction of significant additional jitter in the controlled frequency divider. The control signal may contain an offset. The divided signal typically contains the jitter or noise introduced by the controlled frequency divider as dominant noise source.

The second input signal has typically also a very stable frequency at least for the short term. The second input signal may vary over time due to temperature, but these changes may be considered relatively slow compared to other sources disturbing the frequency and phase shift of the second input signal. Typically, the second input signal may be generated with the use of a resonator, such as a crystal resonator.

The frequency phase detector detecting the phase between the divided signal and the second input signal typically also introduces noise. Therefore, the value, such as the height, of the phase difference signal is typically dominated by the phase difference and typically additionally comprises the noise introduced by the controlled frequency divider and the frequency phase detector.

The loop filter filters the phase difference signal. The output signal of the loop filter is the control signal, which is indicative of the frequency ratio. The loop filter is typically a low-pass filter. The loop filter cut-off frequency is selected based on the two limitations. If the cut-off frequency is selected too low, the loop will react too slow to disturbances in the loop causing instability of the loop. If the cut-off frequency is selected too high, the loop will not reject the noise in the phase difference signal enough also possibly causing instability of the loop. Instability of the loop may be detected from an instable control signal. An instable control signal may have a signal value swinging from one end of the range to another end of its range or be stuck at one of the extremes. The cut-off frequency is typically selected such low that the maximum amount of noise is rejected from the phase difference signal while the control signal is still allowed to adapt quickly enough to any disturbances introduced in the loop.

The circuit provides the advantage of a very stable frequency ratio measurement over the prior art. As the prior art has no integrating effect, the circuit according to the current invention has a feedback loop having an integrating effect. The integrating effect provides the advantage of a 20 dB/decade rejection of low frequency noise for the phase. This effect in the frequency domain cause a 40 dB/decade rejection, while known systems only have a 20 dB/decade rejection.

Furthermore, the current invention provides that the temperature behaviour of the filtering components, such as the loop filter, is transposed to nearly DC with the effect of that small deviations only slightly changes the effective bandwidth, but does not change the actual centre frequency. In comparison, known in the art are loop filters, wherein the known loop maintains a certain frequency and thus these known loop filters are band-pass filters. If components of the known loop filter change in value under the influence of temperature or aging for example, the centre frequency of the known loop filter will change. Therefore, the circuit according to the current invention provides the advantage of an increased temperature stability.

As argued below, this circuit is suitable for having a resonator providing the second input signal and providing an excitation signal to the resonator based on the divided signal. As further argued below the circuit provides the advantage of not having to comply to the Barkhausen criterium. This not complying to the Barkhausen criterium has the effect of reducing the phase noise.

Prior art loops complying to the Barkhausen criterium may be compared to an AM-signal transmission. The current invention, not complying to the Barkhausen criterium may be compared to a FM-signal transmission. FM-signals are known to be less prone to disturbances. One of such disturbances in the current invention may be a small and adjacent resonance frequency. These small and adjacent resonance frequencies may even cross-over under the influence of a temperature change. Especially in these cases not having to comply to the Barkhausen criterium provides the advantage of a considerable rejection of the noise generated by the small and adjacent resonance frequency.

Generating particular frequencies with low phase noise requires a substantial amount of power. This embodiment provides the advantage of generating two independent frequencies, the first and second frequencies, with low phase noise without doubling the power, but with much less power consumed by the circuit.

In an embodiment of the invention, the phase difference signal has a magnitude, such as an amplitude or a value, based on the frequency phase difference and/or the control signal has a magnitude, such as an amplitude or a value, indicative of the frequency ratio. If the phase or control signal is an analogue signal, the signal information is typically advantageously contained in the amplitude of the signal. If the phase or control signal is a digital signal, the signal information is typically advantageously contained in a digital value of the signal. The digital value may be a binary code, BCD code, Gray code or combination of these codes or any other code having a defined value system.

In an embodiment of the invention, the loop filter is a lowpass filter, preferably having a cut-off frequency advantageously below the frequency noise introduced by the controlled frequency divider and preferable advantageously above a rate of change of the first and second frequencies. Furthermore, the cut-off frequency should be advantageously selected such that the control signal is inside a specified range, while the circuit remains stable under changing conditions causing disturbances in the circuit. The specified range is typically user specified. The specified range may also be determined based on the noise introduced by the other features in the circuit, such as the controlled frequency divider and the frequency phase detector. The specified range may also be influenced by the variations of the first input signal and the second input signal.

In an embodiment of the invention, the controlled frequency divider is a controlled fractional frequency divider. A phase difference between the divided signal and the second input signal may be caused by a static phase difference and/or a frequency difference and lapsing time. In this embodiment, the use of a controlled fractional frequency divider advantageously allows for improved frequency matching between the frequency of the divided signal and the second frequency because the first frequency is divided with a higher granularity. Furthermore, as the granularity is higher, the first frequency may advantageously be selected lower. The use of high frequencies has the disadvantage of cross-talk, increased energy loss, etc.

In an embodiment of the invention, the circuit further comprises an analogue to digital converter arranged for generating a digital second input signal based on the second input signal, wherein the digital second input signal is supplied to the frequency phase detector. The divided signal may be an analogue signal resulting in a hybrid frequency phase detector having one analogue and one digital input. The divided signal may be a digital signal resulting in a digital frequency phase detector. Depending on the operation, manipulating input signals in the digital or analogue domain may advantageously be done in one of the domains.

In low power conditions, an analogue block, such as a Gilbert cell used as analogue frequency phase detector, typically adds substantial noise due to that the signal is not that strong in the analogue block relative to noise sources within the analogue block. Furthermore, semiconductor components in the analogue block operating at their lowest power limit add relatively a lot of noise. On the other hand, in low power conditions, a digital block, such as a digital mixer, continues to operate as long as the conditions of the digital signal are met. No additional noise is added in these low power conditions. And when well designed, a digital block will add no significant noise to the signal. Hence, the current invention is advantageously implemented at least partly in the digital domain, preferably for the most part in the digital domain, more preferably with as much as possible in the digital domain. Block in the current invention may be implemented partly in the digital domain.

In an embodiment of the invention, the circuit further comprises a signal generator generating the first frequency, wherein the rate of frequency change is within the dynamic frequency tracking range of the loop. Depending on the combination of elements in the loop of the circuit, the circuit is capable of tracking frequency change of the first frequency. If the rate of change of the first frequency is too high, the divided signal will have a different frequency compared to the second frequency, which will cause an increasing deviation in the phase difference signal with the lapsing of time. As the increasing deviation in the phase difference signal is mainly filtered out by the loop filter, the change of the control signal will not follow the increasing deviation of the phase difference signal. Therefore, the control signal is at least temporarily not indicative of the frequency difference between the first and second input signal. The loop may even stabilize at a point that the frequency of the divided signal is e.g. a multiple of the second frequency. This is typically called that the loop is out-of-lock. The maximum rate of change of the first frequency whereby the control signal is still indicative of the frequency ratio with a specified error margin marks the edge of the dynamic frequency tracking range. For a change in first frequency within the dynamic frequency tracking range, the circuit cannot go out-of-lock.

According to the invention, the circuit further comprises a resonator, wherein an excitation signal having the divided frequency is based on the divided signal;

wherein the resonator is excited based on the excitation signal; and wherein the resonator generates the second input signal.

A resonator may be added to the circuit. This provides the advantage of a simple frequency generator. Further, a resonator loop is formed by the controlled frequency divider, the excitation signal, the resonator, the second input signal, the frequency phase detector, the phase difference signal, the loop filter and the control signal. Loops comprising a resonator or oscillator commonly adhere to the Barkhausen criterium. The Barkhausen criterium contains the following constrains:

the absolute magnitude of the gain of the loop equals 1; and the phase shift of the loop is $2\pi x$; $x \in \mathbb{N}_0^+$ The Barkhausen criterium typically implies additional design constrains for the resonator loop. A loop complying to the Barkhausen criterium is typically hard to design and introduces additional phase noise. Typically, a loop comprising a regular amplifier for making the loop comply to the Barkhausen criterium introduces considerable phase noise.

The controlled frequency divider divides the first frequency based on the control signal to generate an excitation signal having the divided frequency. The control signal is not used to determine the magnitude, such as the amplitude or value, of the excitation signal. The magnitude of the excitation signal may be based on the magnitude of the first input signal. The magnitude of the excitation signal may be based on the specifications of the resonator, possibly taking into account the divided frequency. The magnitude of the excitation signal may advantageously be selected to optimize the functioning of the resonator. Thus, the loop of the circuit advantageously does not have to comply to the Barkhausen criterium. Thus, the loop does not comprise a regular amplifier for complying to the Barkhausen criterium and thus has a reduced phase noise.

In an embodiment of the invention, the excitation signal is shifted in phase relative to the second input signal. Typically, the phase shift is a constrain of the inputs of the controlled frequency divider. For example, a mixer as frequency phase detector requires his input signals to be shifted by 90 degrees in phase for generating a phase difference signal indicating that the input signals are in phase with each other. As the resonator typically generates 0 degrees phase shift, when in resonance, between the excitation signal and the second input signal, the excitation signal and divided signal already need to have these 90 degrees phase shift between them. The controlled frequency divider advantageously provides this phase shift. The controlled frequency divider may advantageously provide this phase shift if the frequency division is by a multiple of four or is a fractional divider.

In an embodiment of the invention the excitation signal is substantially in phase with the second input signal. This provides an advantageously simple implementation.

In an embodiment of the invention, the second frequency is a resonance frequency of the resonator. Selecting a resonance frequency of the resonator provides the advantage of low energy consumption in the resonator for generating a second input signal with enough magnitude for the frequency phase detector to detect a phase difference. Low energy consumption provides the advantage of low local temperature rise, enabling further integration of the circuit.

In an embodiment of the invention, the resonator is a crystal resonator and preferably the second frequency is an overtone resonance frequency of the crystal resonator. A crystal is a readably available solution for a resonator.

Harmonic frequencies change in frequency under the influence of temperature in a similar manner as the fundamental frequency. In contrast, overtone frequencies may change frequency in a different manner under the influence of temperature. Furthermore, different overtones of a crystal may change in frequency in a different manner under the influence of temperature. Thus, different overtones may have different temperature gradients. As an overtone of the crystal may be selected, the circuit can advantageously be designed to have a predefined temperature behaviour based on the predefined behaviour of the resonator.

In an embodiment of the invention, the circuit further comprises a digital to analogue converter (DAC) arranged for generating a divided analogue signal based on the divided signal, wherein the divided analogue signal is supplied to the resonator. The divided analogue signal may be the excitation signal for the resonator. A digital controlled frequency divider is simpler in implementation and can be easily controlled. The resonator is an analogue component. Adding a DAC between the digital controlled frequency divider and the resonator provides the advantage of coupling two advantageous partial solutions in the digital and analogue domain respectively.

In an embodiment of the invention, the circuit is arranged for determining a second frequency ratio between a third input signal having a third frequency and the second input signal having a fourth frequency, wherein the circuit comprises:

a second controlled fractional frequency divider arranged for generating a second divided signal having a second divided frequency being substantially the third frequency divided by a second control signal;

an adder arranged for generating an added signal supplied to the resonator, wherein the added signal is based upon adding the divided signal and the second divided signal;

a second frequency phase detector arranged for generating a second phase difference signal based on a second frequency phase difference between the second divided frequency of the second divided signal and the fourth frequency of the second input signal; and a second loop filter arranged for generating the second control signal based on the second phase difference signal;

wherein a second loop is formed by the second controlled fractional frequency divider, the second divided signal, the second frequency phase detector, the second phase difference signal, the second loop filter and the second control signal;

wherein the second loop filter filters the second phase difference signal such that instability of the second loop is prevented; and wherein the second control signal, preferably the magnitude of the second control signal, is indicative of the second frequency ratio.

This embodiment of the circuit advantageously uses the property of the resonator that the resonator may resonate at multiple frequencies at the same time. Resonators are typically bulky compared to the other elements of the circuit. Thus, using the resonator to resonate at multiple frequencies allows integration and miniaturization of the circuit.

Furthermore, as the first and second loops are parallel and are evaluated simultaneously, the temperature effects are measured at the same time. Known circuits may have the tendency to measure temperature effects spaced in time. This time spacing causes temperature inaccuracies in known circuits if the temperature changes over time. The circuit according to the current invention has therefore the advantage of improved accuracy of the temperature measurement.

Furthermore, this embodiment advantageously allows to measure hysteresis behaviour of the resonator in operation. Known circuits tend to compensate for hysteresis in the resonator by designing in countermeasures from a theoretical point. A known compensation is to make the system more rugged making the system less accurate. Hence, this embodiment provides the advantage of improved accuracy due to hysteresis measurement.

In an embodiment of the invention, the second phase difference signal has a second magnitude based on the second frequency phase difference and/or the second control signal has a magnitude indicative of the second frequency ratio. The advantages are comparable with the advantages for the control signal.

In an embodiment of the invention, the resonance frequency and the second resonance frequency are different. As the noise generated by circuit elements at different frequencies may be different, the noise in the control signal and the second control signal may be uncorrelated. As the noise is uncorrelated, this may advantageously be used to improve the accuracy of the determined frequency ratio.

In an embodiment of the invention, the resonator is a crystal resonator and the resonance frequency and/or the second resonance frequency are overtone frequencies of the crystal resonator. An overtone frequency has a typical behaviour, especially temperature behaviour, that makes the circuit suitable for particular applications. By selecting such an overtone frequency, the circuit may advantageously be made applicable to such applications.

Preferably, the resonance frequency and the second resonance frequency have different temperature gradients. As an overtone frequency has typically a different temperature gradient compared to other overtone frequencies, harmonic frequencies and the fundamental frequency, the circuit may advantageously be used to determine the temperature of the resonator, preferably a crystal resonator.

In an embodiment of the invention, the third input signal is the first input signal. This circuit configuration provides the advantage of measuring two frequency ratios with one reference. In combination with the feature that the resonance frequency and the second resonance frequency have different temperature gradients, the change of the first frequency over temperature may be eliminated by dividing the two ratios or weighted division by each other. Tracking the change of the resulting signal over time is indicative of the temperature of the resonator, while providing the advantage of minimizing or even eliminating the influence of the temperature gradient of the first frequency provided to the circuit.

In an embodiment of the invention, the circuit is arranged for determining a third frequency ratio between a fourth input signal having a fifth frequency and the second input signal having a sixth frequency, wherein the circuit comprises:

a third controlled fractional frequency divider arranged for generating a third divided signal having a third divided frequency being substantially the fifth frequency divided by a third control signal;

a third frequency phase detector arranged for generating a third phase difference signal based on a third frequency phase difference between the third divided frequency of the third divided signal and the sixth frequency of the second input signal; and a third loop filter arranged for generating the third control signal based on the third phase difference signal;

wherein the added signal is further based upon adding the third divided signal;

wherein a third loop is formed by the third controlled fractional frequency divider, the third divided signal, the third frequency phase detector, the third phase difference signal, the third loop filter and the third control signal;

wherein the third loop filter filters the third phase difference signal such that instability of the third loop is prevented; and wherein the third control signal is indicative of the third frequency ratio.

This embodiment of the circuit advantageously uses the property of the resonator that the resonator may resonate at multiple frequencies at the same time. Resonators are typically bulky compared to the other elements of the circuit. Thus, using the resonator to resonate at multiple frequencies allows integration and miniaturization of the circuit.

Furthermore, as the first, second and third loops are parallel and are evaluated simultaneously, the temperature effects are measured at the same time. Known circuits may have the tendency to measure temperature effects spaced in time. This time spacing causes temperature inaccuracies in known circuits if the temperature changes over time. The circuit according to the current invention has therefore the advantage of improved accuracy of the temperature measurement.

Furthermore, this embodiment advantageously allows to measure hysteresis behaviour of the resonator in operation.

Known circuits tend to compensate for hysteresis in the resonator by designing in countermeasures from a theoretical point. A known compensation is to make the system more rugged making the system less accurate. Hence, this embodiment provides the advantage of improved accuracy due to hysteresis measurement.

In an embodiment of the invention, the third phase difference signal has a third magnitude based on the third frequency phase difference and/or the third control signal has a magnitude indicative of the third frequency ratio. The advantages are comparable with the advantages for the control signal.

In an embodiment of the invention, the second frequency and the fourth frequency are different; wherein the second frequency and the sixth frequency are different; and/or wherein the fourth frequency and the sixth frequency are different. As the noise generated by circuit elements at different frequencies may be different, the noise in the control signal, the second control signal and the third control signal may be uncorrelated. As the noise is uncorrelated, this may advantageously be used to improve the accuracy of the determined frequency ratio.

In an embodiment of the invention, the sixth frequency is an overtone frequency of the crystal resonator. An overtone frequency has a typical behaviour, especially temperature behaviour, that makes the circuit suitable for particular applications. By selecting such an overtone frequency, the circuit may advantageously be made applicable to such applications.

Preferably, the resonance frequency, the second resonance frequency and the third resonance frequency have different temperature gradients. As an overtone frequency has typically a different temperature gradient compared to other overtone frequencies, harmonic frequencies and the fundamental frequency, the circuit may advantageously be used to determine the temperature of the resonator, preferably a crystal resonator.

In an embodiment of the invention, the fourth input signal is the first input signal. This circuit configuration provides the advantage of measuring three frequency ratios with one reference. In combination with the feature that the resonance frequency, the second resonance frequency and the third resonance frequency have different temperature gradients, the change of the first frequency over temperature may be eliminated by dividing the two ratios or weighted division by each other. Tracking the change of the resulting signal over time is indicative of the temperature of the resonator, while providing the advantage of minimizing or even eliminating the influence of the temperature gradient of the first frequency provided to the circuit.

Furthermore, this determining of an indication may also involve the first and the third ratio, providing a second indication providing the advantage of a total more stable and/or accurate indication.

Furthermore, the first and second indications have typically temperatures where the change of the indication is zero or substantially zero for a change of temperature. If the condition is met that the first and second indication have distinctive temperatures where the indication is zero or substantially zero for a change of temperature, then the temperature of the resonator may advantageously be measured with a high degree of accuracy over the operational temperature range.

According to another aspect of the invention, a system for determining a temperature indication of a resonator, wherein the system comprises:

a circuit according to any of the circuit embodiments comprising the resonator and providing the control signal and the second control signal; and a control signal divider arranged for generating a divided control signal based on division of the control signal by the second control signal;

wherein the divided control signal is the temperature indication. The temperature indication provides the advantages as described in this description.

Further, the use of parallel simultaneous loops has the advantage that it makes close correlation of certain effects possible. For example, suppose the first input frequency changes a small amount in value. This change may be seen as phase noise of the first input frequency. Then all loops will encounter the same relative error contribution. This error contribution will result in changes of the respective ratios, but as these ratios are divided, resulting in a divided control signal, the error contributions cancel each other out. Hence, this system provides the advantage of being or substantially being insensitive to first input frequency phase noise.

According to another aspect of the invention, a system for determining a temperature indication of a resonator, wherein the system comprises:

a circuit according to any of the circuit embodiments comprising the resonator and providing the control signal, the second control signal and the third control signal; and a first control signal divider arranged for generating a first divided control signal based on division of the control signal by the second control signal;

a second control signal divider arranged for generating a second divided control signal based on division of the control signal by the third control signal; and a subtractor arranged for generating a subtracted signal based on subtracting the second divided control signal from the first divided control signal;

wherein the first divided control signal and the second divided control signal have distinct minimum temperature activities; and wherein the subtracted signal is the temperature indication. The temperature indication provides the advantages as described in this description. Further, the use of parallel simultaneous loops has the advantage that it makes close correlation of certain effects possible.

According to another aspect of the invention, a method for determining a frequency ratio between a first input signal having a first frequency and a second input signal having a second frequency, wherein the method comprises the steps of:

generating a divided signal having a divided frequency being substantially the first frequency divided by a control signal;

generating a phase difference signal based on a frequency phase difference between the divided frequency of the divided signal and the second frequency of the second input signal; and generating the control signal based on filtering the phase difference signal;

wherein a loop is formed by the divided signal, the phase difference signal and the control signal;

wherein the filtering filters the phase difference signal such that instability of the loop is prevented; and wherein the control signal is indicative of the frequency ratio. This method provides advantages as described throughout the text.

According to another aspect of the invention, a method for determining a temperature indication of a resonator, wherein the method comprises the steps of:

generating a first divided signal having a first divided frequency being substantially a first frequency of a first input signal divided by a first control signal;

generating a second divided signal having a second divided frequency being substantially the first frequency of the first input signal divided by a second control signal;

generating an added signal supplied to the resonator, wherein the added signal is based upon adding the first divided signal and the second divided signal;

supplying the added signal to the resonator;

receiving a second input signal from the resonator, which second input signal comprises first and second frequencies, which are responses of the resonator to the first and second divided frequencies;

generating a first phase difference signal based on a first frequency phase difference between the first divided frequency of the first divided signal and the first frequency of the second input signal;

generating the first control signal based on filtering the first phase difference signal;

generating a second phase difference signal based on a second frequency phase difference between the second divided frequency of the second divided signal and the second frequency of the second input signal;

generating the second control signal based on filtering the second phase difference signal;

generating a divided control signal based on division of the first control signal by the second control signal;

wherein a first loop is formed by the first divided signal, the first phase difference signal and the first control signal;

wherein a second loop is formed by the second divided signal, the second phase difference signal and the second control signal;

wherein the filtering providing the first control signal filters the first phase difference signal such that instability of the first loop is prevented;

wherein the filtering providing the second control signal filters the second phase difference signal such that instability of the second loop is prevented;

wherein the first frequency of the second input signal and the second frequency of the second input signal have distinct minimum temperature activities; and wherein the divided control signal is the temperature indication. This method provides advantages as described throughout the text.

According to another aspect of the invention, a method for determining a hysteresis and/or temperature indication of a resonator, wherein the method comprises the steps of:

generating a first divided signal having a first divided frequency being substantially a first frequency of a first input signal divided by a first control signal;

generating a second divided signal having a second divided frequency being substantially the first frequency of the first input signal divided by a second control signal;

generating a third divided signal having a third divided frequency being substantially the first frequency of the first input signal divided by a third control signal;

generating an added signal supplied to the resonator, wherein the added signal is based upon adding the first divided signal, the second divided signal and the third divided signal;

supplying the added signal to the resonator;

receiving a second input signal from the resonator, which second input signal comprises first, second and third frequencies, which are responses of the resonator to the first, second and third divided frequencies;

generating a first phase difference signal based on a first frequency phase difference between the first divided frequency of the first divided signal and the first frequency of the second input signal;

generating the first control signal based on filtering the first phase difference signal;

generating a second phase difference signal based on a second frequency phase difference between the second divided frequency of the second divided signal and the second frequency of the second input signal;

generating the second control signal based on filtering the second phase difference signal;

generating a third phase difference signal based on a third frequency phase difference between the third divided frequency of the third divided signal and the third frequency of the second input signal;

generating the third control signal based on filtering the third phase difference signal;

generating a first divided control signal based on division of the first control signal by the second control signal;

generating a second divided control signal based on division of the first control signal by the third control signal; and generating a subtracted signal based on subtracting the second divided control signal from the first divided control signal;

wherein a first loop is formed by the first divided signal, the first phase difference signal and the first control signal;

wherein a second loop is formed by the second divided signal, the second phase difference signal and the second control signal;

wherein a third loop is formed by the third divided signal, the third phase difference signal, and the third control signal;

wherein the filtering providing the first control signal filters the first phase difference signal such that instability of the first loop is prevented;

wherein the filtering providing the second control signal filters the second phase difference signal such that instability of the second loop is prevented;

wherein the filtering providing the third control signal filters the third phase difference signal such that instability of the third loop is prevented;

wherein the first frequency of the second input signal and the second frequency of the second input signal and the third frequency of the second input signal have relative to each other distinct minimum temperature activities; and wherein the subtracted signal is the hysteresis and/or temperature indication. This method provides advantages as described throughout the text.

BRIEF DESCRIPTION OF THE DRAWINGS

The invention will be apparent from and elucidated further with reference to the embodiments described by way of example in the following description and with reference to the accompanying drawings, in which:

FIG. 8 schematically shows a first system according to a fourth embodiment of the current invention; and FIG. 9 schematically shows a second system according to a fifth embodiment of the current invention.

The figures are purely diagrammatic and not drawn to scale. In the figures, elements which correspond to elements already described may have the same reference numerals.

LIST OF REFERENCE NUMERALS

| | |
|---|---|
| 100 | first embodiment circuit |
| 101 | second embodiment circuit |
| 102 | third embodiment circuit |
| 104 | first input signal |
| 105 | third input signal |
| 106 | fourth input signal |
| 107 | (first) control signal |
| 108 | second control signal |
| 109 | third control signal |
| 110 | (first) controlled fractional frequency divider |
| 111 | second controlled fractional frequency divider |
| 112 | third controlled fractional frequency divider |
| 115 | (first) divided signal |
| 116 | second divided signal |
| 117 | third divided signal |
| 120 | adder |
| 121 | added signal |
| 125 | digital to analogue converter (DAC) |
| 129 | excitation signal |
| 130 | resonator |
| 135 | second input signal |
| 140 | analogue to digital converter (ADC) |
| 145 | digital second signal |
| 150 | (first) frequency phase detector |
| 151 | second frequency phase detector |
| 152 | third frequency phase detector |
| 155 | (first) phase difference signal |
| 156 | second phase difference signal |
| 157 | third phase difference signal |
| 160 | (first) loop filter |
| 161 | second loop filter |
| 162 | third loop filter |
| 200 | first embodiment system |
| 201 | second embodiment system |
| 210 | first circuit comprising resonator |
| 211 | second circuit comprising resonator |
| 220 | (first) divider |
| 221 | second divider |
| 225 | first indication |
| 226 | second indication |
| 230 | subtractor |
| 235 | subtracted signal |

DETAILED DESCRIPTION OF EXEMPLARY EMBODIMENTS

The following figures may detail different embodiments. Embodiments can be combined to reach an enhanced or improved technical effect. These combined embodiments may be mentioned explicitly throughout the text, may be hint upon in the text or may be implicit.

Figure 1:
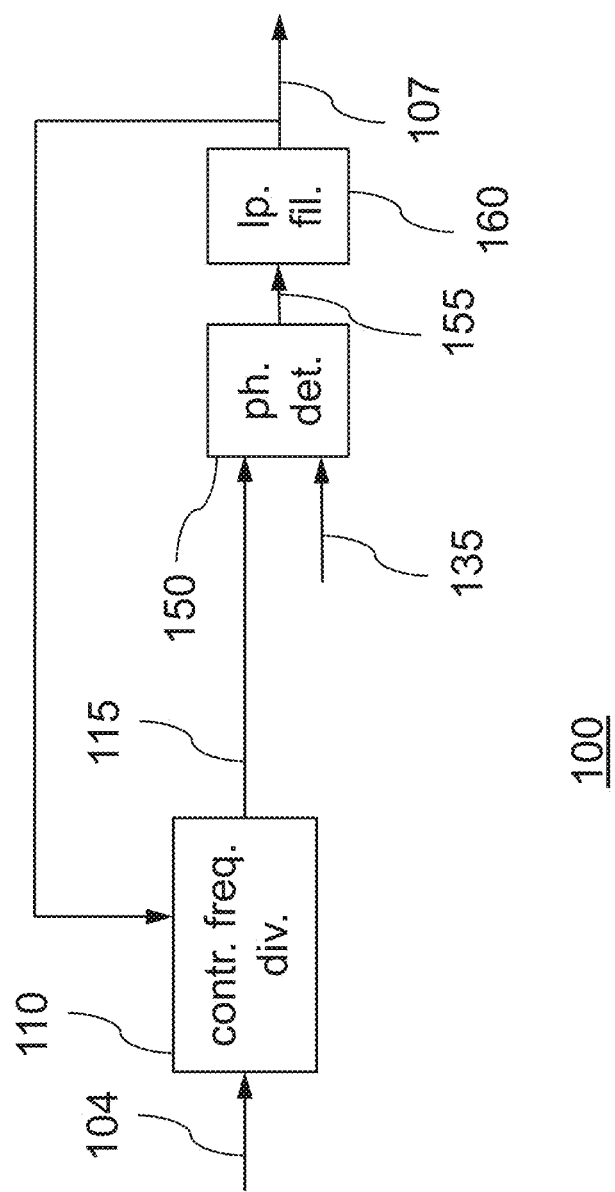
FIG. 1 schematically shows a first circuit according to a first embodiment of the current invention.

FIG. 1 schematically shows a circuit 100 according to a first embodiment of the current invention. The circuit comprises a controlled frequency divider 110, a frequency phase detector 150 and loop filter 160. The controlled frequency divider may also be labelled first controlled frequency divider. The frequency phase detector can also be labelled phase detector, first phase detector or first frequency phase detector. The loop filter may also be labelled first loop filter.

The controlled frequency divider takes as inputs a first input signal 104 and a control signal 107 and provides as output a divided signal 115. The control signal may also be labelled first control signal. The divided signal may also be labelled first divided signal. The first input signal is a periodic signal having a first frequency. The control signal is typically a signal with a large amount of energy in the lower frequencies, such as substantially close to 0 Hz.

The controlled frequency divider generates the divided signal. The divided signal is a periodic signal having a divided frequency. The divided frequency relates to the first frequency based on the magnitude of the control signal. The magnitude of a signal may be an amplitude of the signal, a value of the signal or any other property of the signal expressing a measure. In case the control signal is an analogue signal, the magnitude is typically an amplitude of the signal. In case the control signal is a digital signal, the magnitude is typically a value of the signal. Typically, the relation between inputs and outputs of the controlled frequency divider may be linearized to $$f_{out} = \frac{f_{in}}{x-a}; x-a \in \mathbb{Z}^+, a \in \mathbb{Z},$$

wherein x is the magnitude of the control signal and a is an offset. In practical implementations the set of numbers for x and x-a are selected much more limited.

The phase detector takes as inputs the divided signal and a second input signal 135 and provides as output a first phase difference signal 155. The second input signal is a periodic signal having a second frequency. The first phase difference signal may also be labelled phase difference signal.

The magnitude of the phase difference signal relates to the phase difference between divided frequency and the second frequency. Typically, depending on the implementation of the phase detector, the magnitude of the phase difference signal may have a minimum at 0 degrees, -90 degrees or 90 degrees phase difference.

The loop filter takes as input the phase difference signal and provides as output the control signal. The loop filter is typically a low-pass filter. The loop filter stabilizes the loop or feedback loop formed by the controlled frequency divider, the divided signal, the frequency phase detector, the phase difference signal, the loop filter and the control signal.

Suppose the first frequency is not changing. Furthermore, suppose the divided frequency is slightly higher compared to the second frequency and that the divided signal and the second input signal are in phase. The phase detector will detect an increasing phase difference between the two signals as the second input signal will start lagging behind compared to the divided signal. The increasing phase difference will cause the magnitude of the phase difference signal to increase. With some delay, damping and/or reduction due to being implemented as low-pass filter, the loop filter will increase the magnitude of the control signal. The increase in control signal will cause the first frequency to be divided by a larger magnitude, thus a higher number, to provide a lower divided frequency. Thus, any difference in frequency between the second frequency and the divided frequency is reduced and/or minimized with the negative feedback loop. Furthermore, as the divided frequency tracks the second frequency, the magnitude of the control signal will be indicative of the ratio between the first frequency and the second frequency.

In another scenario, suppose the first frequency is increasing. Furthermore, suppose the second frequency is stable. As the first frequency is increasing and the magnitude of the control signal is stable, the divided frequency will increase. The phase detector will detect an increasing phase difference between the two signals as the second input signal will start lagging behind compared to the divided signal. The increasing phase difference will cause the magnitude of the phase difference signal to increase. With some delay, damping and/or reduction due to being implemented as low-pass filter, the loop filter will increase the magnitude of the control signal. The increase in control signal will cause the first frequency to be divided by a larger magnitude, thus a higher number, to provide a lower divided frequency, which will be substantially the divided frequency before the increase of the first frequency. Thus, any changing first frequency will cause the divided frequency to remain substantially the same to the second frequency due to the negative feedback loop. Furthermore, as the divided frequency tracks the second frequency, the magnitude of the control signal will be indicative of the ratio between the first frequency and the second frequency, which will be increasing in this situation.

As typically the first and second frequency are both changing, a combination of the scenarios above is likely.

In order to get initial lock, the divided frequency needs to be relatively close to the second frequency, such as the resonance frequency of a resonator generating the second frequency, otherwise the lock procedure to get initial lock may be quite complex and lengthy in time. If the first or second frequency or combination of the first and second frequency move faster than the resonator loop can track, lock may be lost. Preferably, the first frequency should not change too fast to allow a faster change of the second frequency. Slow frequency movements of the first and second frequencies over a relatively large range allow lock to be maintained. Fast frequency movements of the first and second frequencies over a relatively small range also allow lock to be maintained.

For some circuits it may be known how much the frequency moves. Combining that knowledge with the circuit allows the selection of a resonator and design of the other elements in the loop for keeping lock during operation. As a rule of thumb, if the dynamic frequency tracking of the loop is slower than the combination of the change of the first and second frequencies, lock will be lost.

Figure 2:
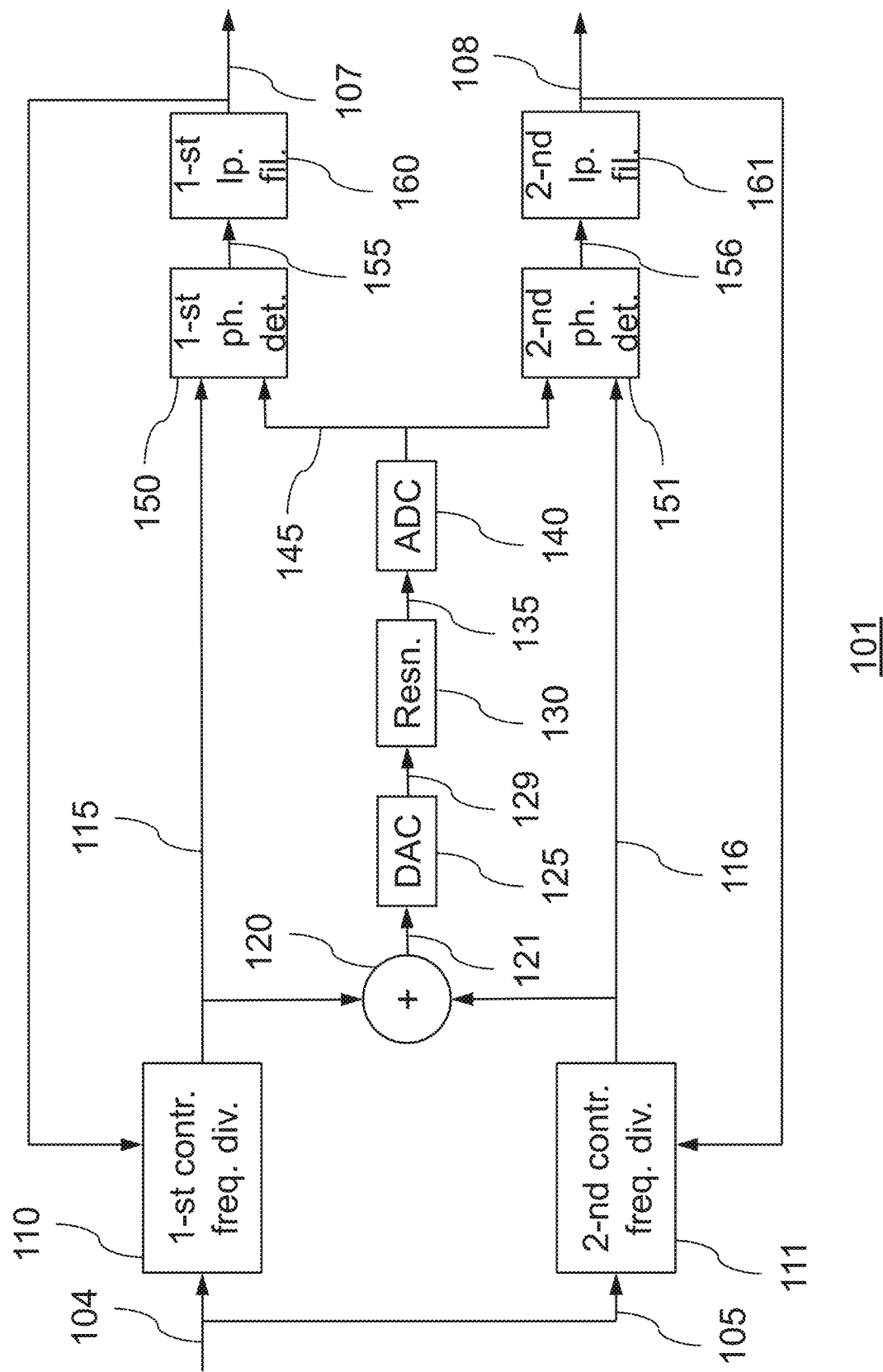
FIG. 2 schematically shows a second circuit according to a second embodiment of the current invention.

FIG. 2 schematically shows a circuit 101 according to a second embodiment of the current invention. The circuit comprises all features as described for FIG. 1. The circuit may further comprise a second controlled frequency divider 111, an adder 120, a DAC 125, a resonator 130, an ADC 140, a second phase detector 151 and a second loop filter 161.

The first controlled frequency 110 divider takes as inputs the first input signal 105 and the first control signal 108 and provides as output the first divided signal 115. The second controlled frequency divider takes as inputs a third input signal 105 and a second control signal 108 and provides as output a second divided signal 116. The adder takes as inputs the first and second divided signals and provides as output an added signal 121. The added signal is the addition of the first and second divided signals.

The optional DAC takes as input the added signal and provides as output an excitation signal 129 suitable for letting the resonator resonate. This provides the advantage of having much of the features of the circuit in the digital domain, while only needing a single DAC for providing an excitation signal, which is typically an analogue signal, to the resonator, which is typically a crystal or crystal oscillator. Furthermore, frequency dividers are typically implemented in the digital domain, providing the advantages of ease of implementation and introduction of limited phase noise. The introduction of limited phase noise is substantially due to that a controlled digital fractional frequency divider has a higher granularity compared to an integer frequency divider.

In an alternative embodiment, two DAC-s are present at respective inputs of the adder, such that the adder is an analogue adder. In another alternative embodiment, the circuit has no DAC in the loop. In even another embodiment, a DAC is between the first loop filter output and the first controlled frequency divider, preferably a second DAC is between the second loop filter output and the second controlled frequency divider.

The optional ADC takes as input the second input signal and provides as output a digital second signal 145. This provides the advantage of having much of the features of the circuit in the digital domain, while only needing a single ADC for receiving the second input signal, which is typically an analogue signal, from the resonator, which is typically a crystal. In an alternative embodiment, two ADC-s are between the respective phase detectors and loop filters. In even another embodiment, the two ADC-s are between respective loop filters and controlled frequency dividers.

The first frequency phase detector 150 takes as inputs the first divided signal 115 and the digital second signal 145 and provides as output the first phase difference signal 155. The second frequency phase detector 151 takes as inputs the second divided signal 116 and the digital second signal 145 and provides as output the second phase difference signal 156. The first loop filter 160 takes as input the first phase difference signal and provides as output the first control signal 107. The second loop filter 161 takes as input the second phase difference signal and provides as output the second control signal 108.

Typically, the first divided frequency and second divided frequency are different frequencies and both resonance frequencies of the resonator. Thus, the resonator is typically a resonator allowing resonances of different frequencies at the same time. Typically, the resonator is a crystal resonator. Furthermore, typically, at least one of the resonances is an overtone resonance, preferably both resonances are overtone resonances.

As described before, if at least one of the first and second divided frequencies are selected at an overtone frequency, the temperature behaviour may be different. The temperature may vary in a temperature range of −40° C. to +125° C. Within this range the temperature gradient for a certain overtone may vary.

Figure 3:
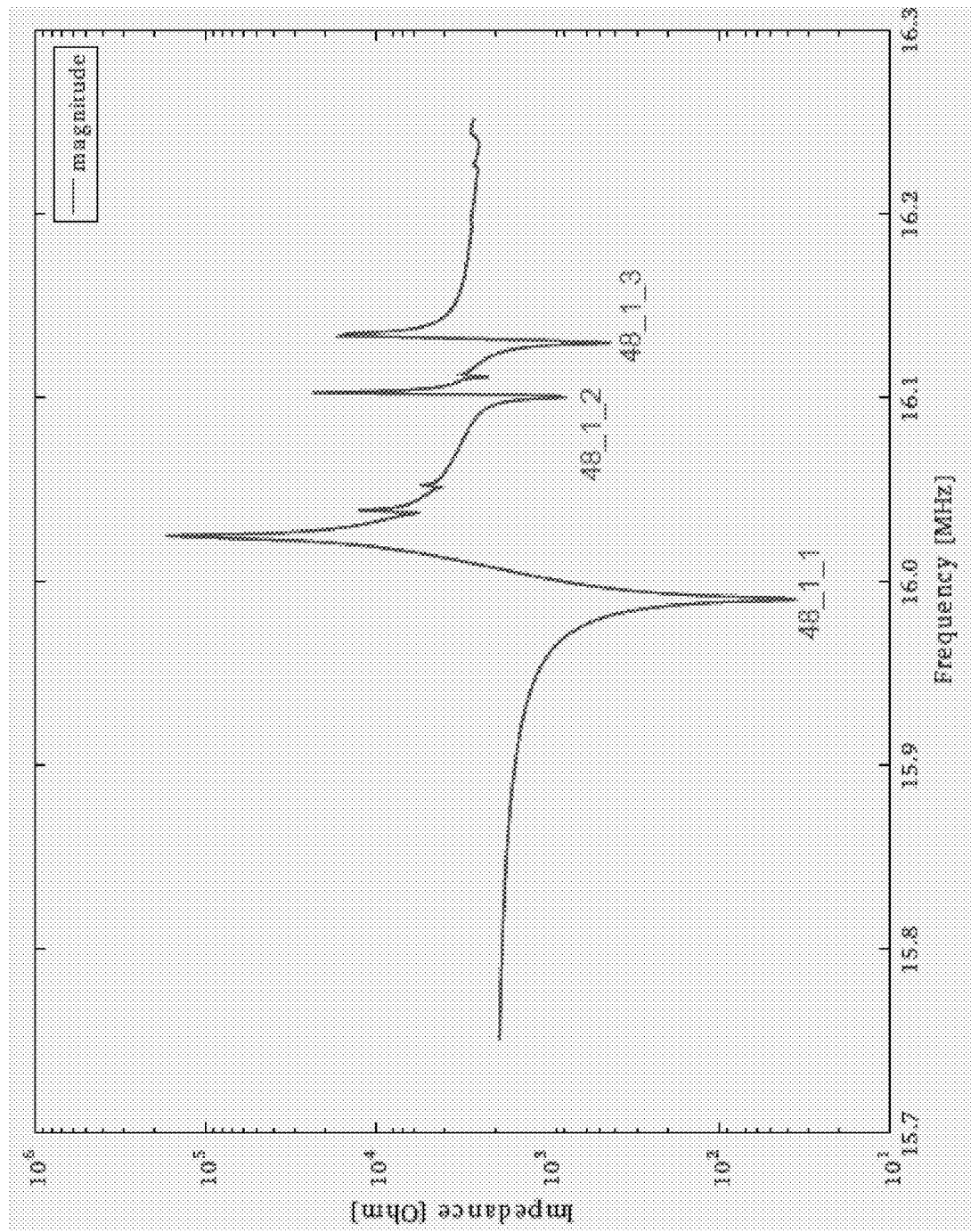
FIG. 3 shows the resonance modes of a crystal in the vicinity of the fundamental resonance frequency.

FIG. 3 shows the resonance modes of a crystal in the vicinity of the fundamental resonance frequency. The crystal was a HC-49U quartz crystal brought in a 3-th overtone resonance. This crystal is a common AT-cut crystal. The most dominant modes are labelled. The measurement is done at room temperature.

Figure 4:
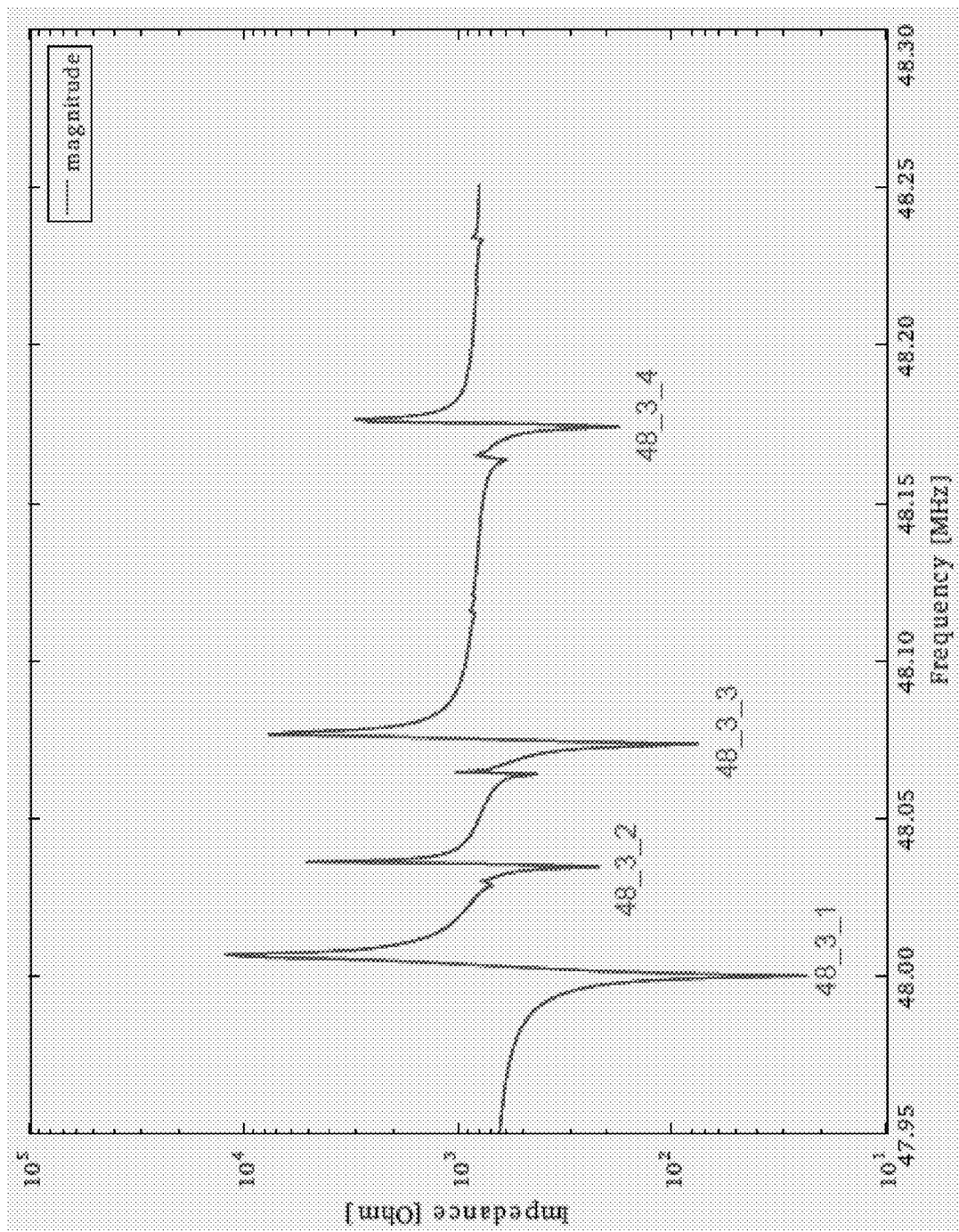
FIG. 4 shows the resonance modes of the crystal in the vicinity of the 3-th harmonic resonance frequency.

FIG. 4 shows the resonance modes of the crystal in the vicinity of the 3-th harmonic resonance frequency. The most dominant modes are labelled. The measurement is done at room temperature.

Figure 5:
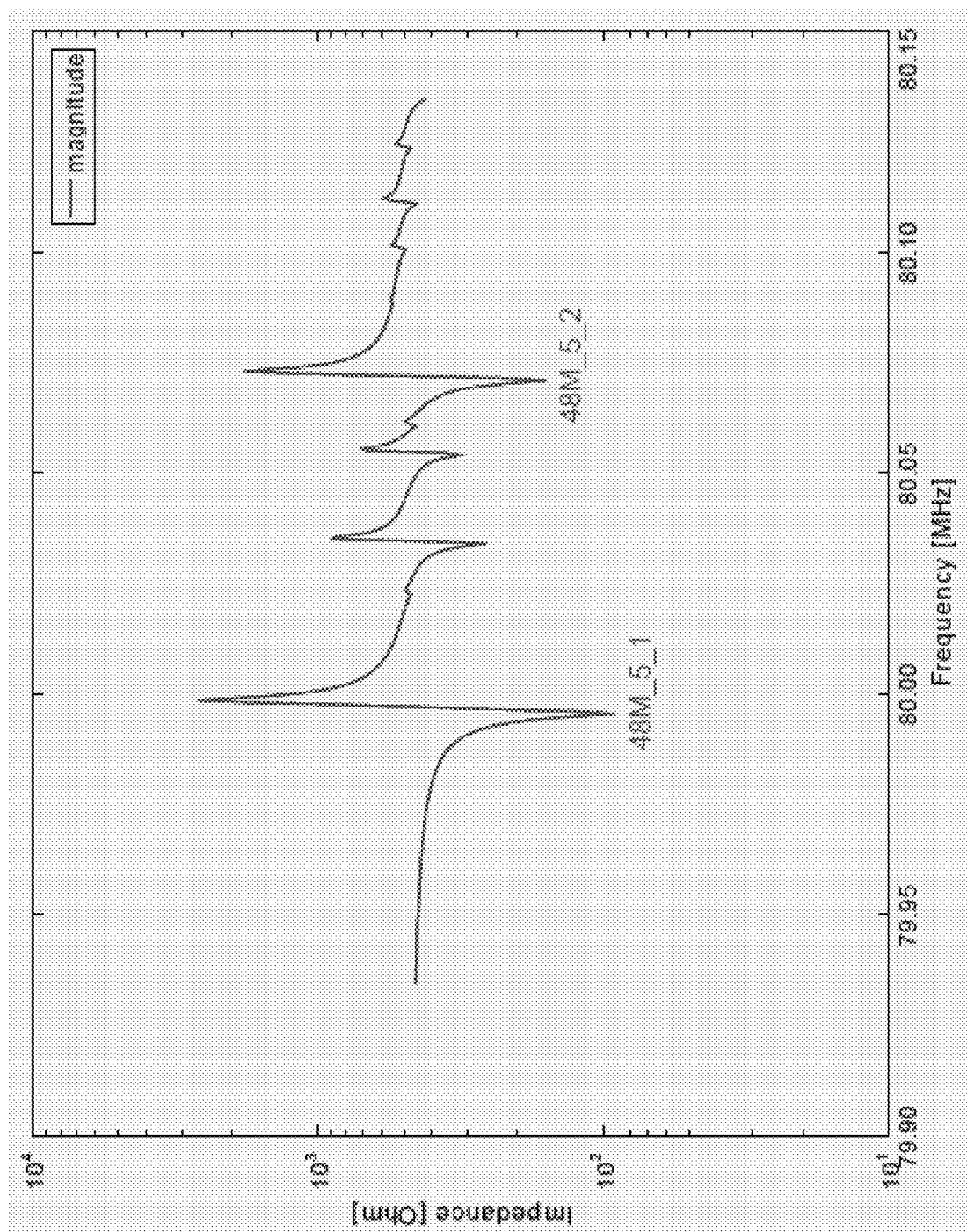
FIG. 5 shows the resonance modes of the crystal in the vicinity of the 5-th harmonic resonance frequency.

FIG. 5 shows the resonance modes of the crystal in the vicinity of the 5-th harmonic resonance frequency. The most dominant modes are labelled. The measurement is done at room temperature.

The table below shows the measured resonance frequencies for the labelled resonance modes.

| Mode | f(resonance) [MHz] |
| --- | --- |
| 48_1_1 | 15.989 |
| 48_1_2 | 16.099 |
| 48_1_3 | 16.129 |
| 48_3_1 | 47.999 |
| 48_3_2 | 48.034 |
| 48_3_3 | 48.072 |
| 48_3_4 | 48.173 |
| 48_5_1 | 79.995 |
| 48_5_2 | 80.070 |

Figure 6:
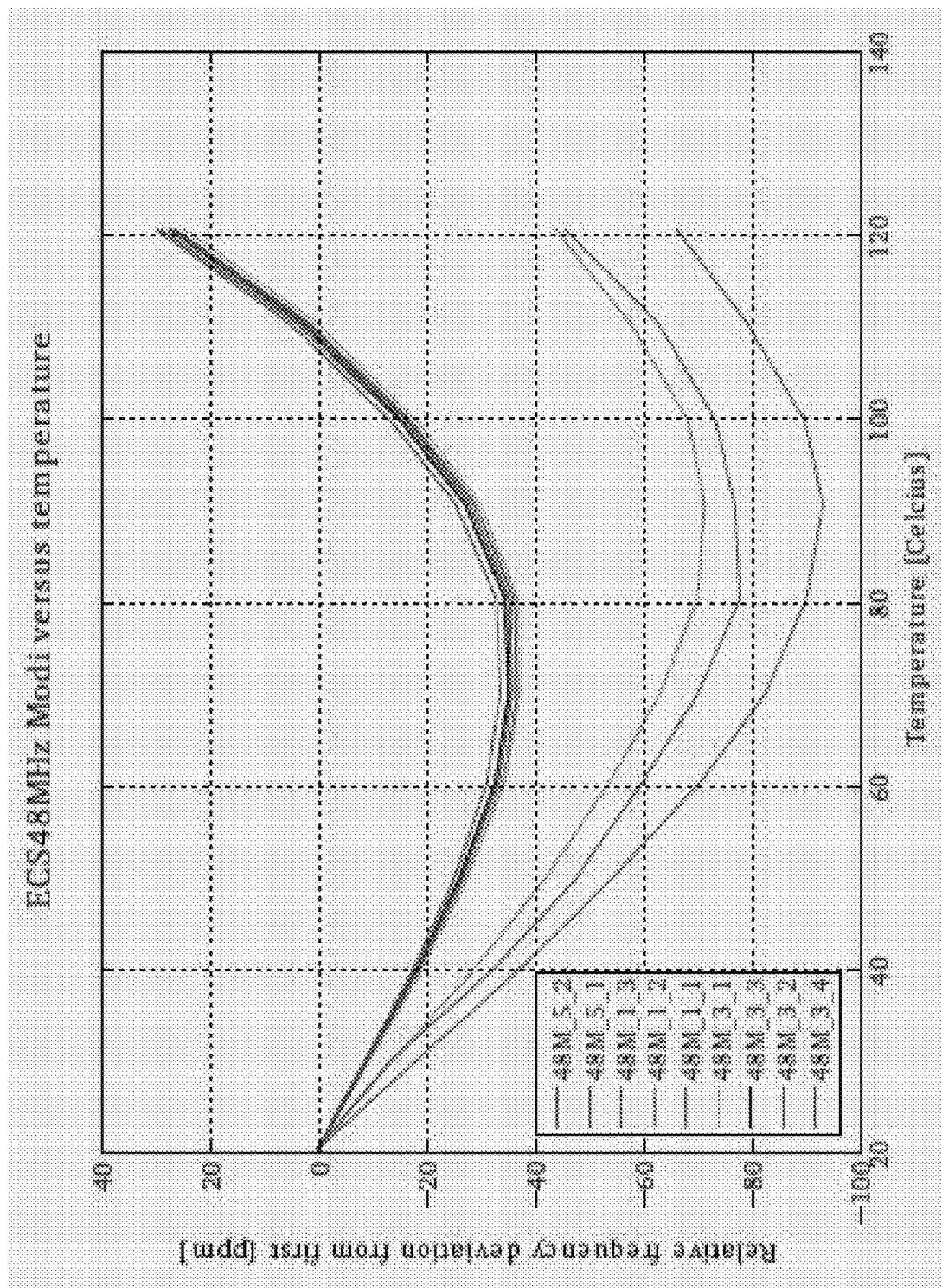
FIG. 6 shows the temperature behaviour of resonance modes over temperature.

FIG. 6 shows the temperature behaviour of resonance modes over temperature. The test set-up comprised the crystal, which was mounted in an aluminium block with a thermal time constant of about one hour. The temperature of this block was stepped from room temperature to 120° C. using steps of 10° C.

FIG. 6 shows on the horizontal axis the temperature. On the vertical axis the frequency deviation is shown in relation to the harmonic frequency, which may also be labelled first overtone frequency.

The measurements show that the higher overtone frequencies deviate from the harmonic frequency over temperature. Also shown is that the rate of deviation changes over temperature. Furthermore, the relative frequency deviation shows a minimum within the temperature range. This minimum means that the rate of frequency change of the harmonic frequency compared to the higher overtone frequency are equal.

Figure 7:
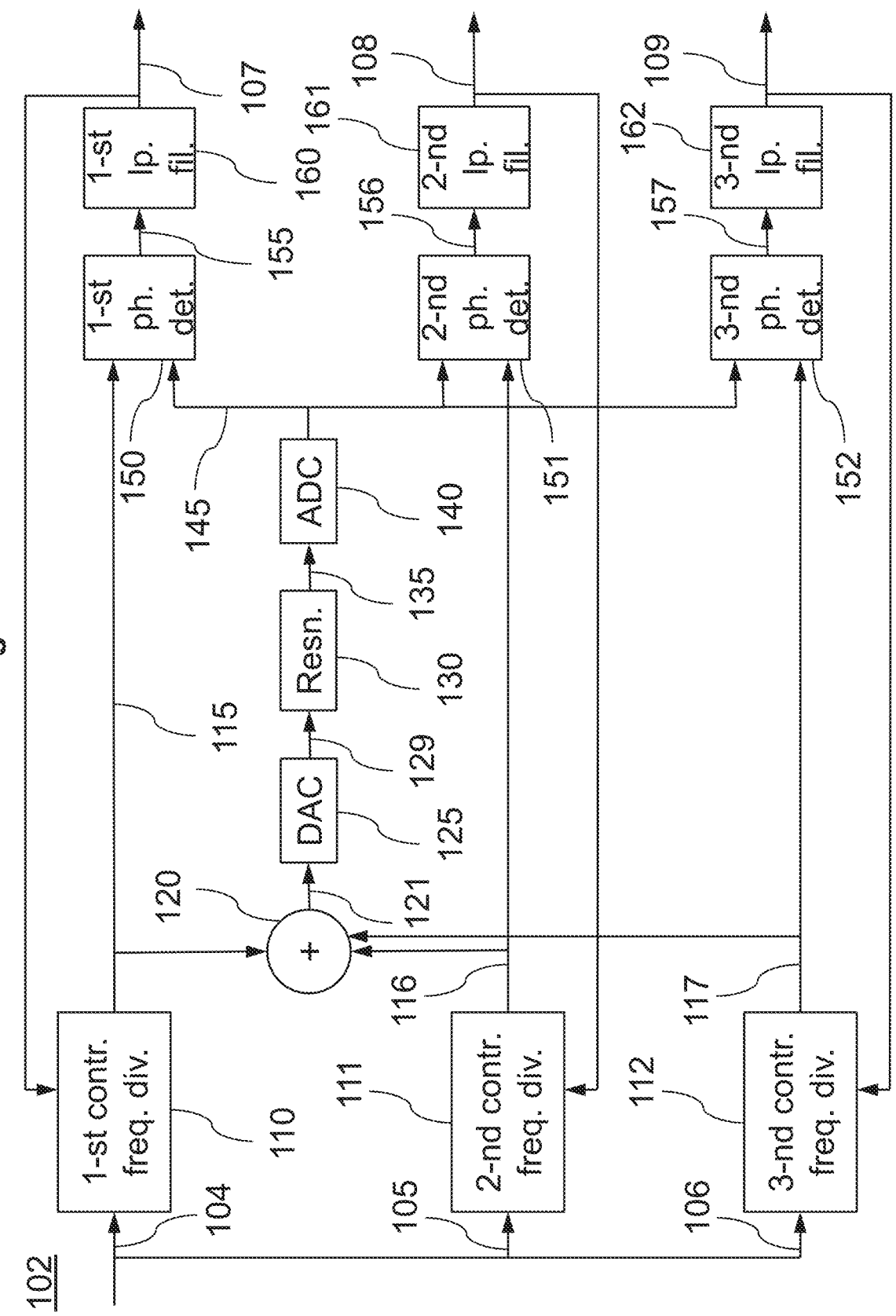
FIG. 7 schematically shows a third circuit according to a third embodiment of the current invention.

FIG. 7 schematically shows a circuit 102 according to a third embodiment of the current invention. The circuit comprises all features as described for FIG. 2. The circuit may further comprise a third controlled frequency divider 112, a third phase detector 152 and a third loop filter 162.

The first controlled frequency 110 divider takes as inputs the first input signal 105 and the first control signal 108 and provides as output the first divided signal 115. The second controlled frequency divider takes as inputs a third input signal 105 and a second control signal 108 and provides as output a second divided signal 116. The third controlled frequency divider takes as inputs a fourth input signal 106 and a third control signal 109 and provides as output a third divided signal 117. The adder takes as inputs the first, second and third divided signals and provides as output an added signal 121. The added signal is the addition of the first, second and third divided signals.

The first frequency phase detector 150 takes as inputs the first divided signal 115 and the digital second signal 145 and provides as output the first phase difference signal 155. The second frequency phase detector 151 takes as inputs the second divided signal 116 and the digital second signal 145 and provides as output the second phase difference signal 156. The third frequency phase detector 152 takes as inputs the third divided signal 117 and the digital third signal 145 and provides as output the third phase difference signal 157. The first loop filter 160 takes as input the first phase difference signal and provides as output the first control signal 107. The second loop filter 161 takes as input the second phase difference signal and provides as output the second control signal 108. The third loop filter 162 takes as input the third phase difference signal and provides as output the third control signal 109.

Typically, the first divided frequency, second divided frequency and third divided frequency are different frequencies and all resonance frequencies of the resonator. Thus, the resonator is typically a resonator allowing resonances of different frequencies at the same time. Typically, the resonator is a crystal resonator. Furthermore, typically, at least two of the resonances are an overtone resonance, preferably all resonances are overtone resonances.

As described before, if at least one of the first and second divided frequencies is selected at an overtone frequency, the temperature behaviour may be different. The temperature may vary in a temperature range of −40° C. to +125° C. Within this range the temperature gradient for a certain overtone may vary.

FIG. 8 schematically shows a system 200 according to a fourth embodiment of the current invention. The system comprises a circuit 210 according to any of the embodiments of the invention comprising the resonator and providing the control signal 107 and the second control signal 108. The system further comprises a control signal divider 220 arranged for generating a divided control signal 225 based on division of the control signal by the second control signal. The divided control signal is the temperature indication 225.

FIG. 9 schematically shows a system 201 according to a fifth embodiment of the current invention. The system comprises a circuit 211 according to any of the embodiments of the invention comprising the resonator and providing the control signal 107, the second control signal 108 and the third control signal 109. The system further comprises a first control signal divider 220 arranged for generating a divided control signal 225 based on division of the control signal by the second control signal. The first divided control signal is the first temperature indication 225. The system further comprises a second control signal divider 221 arranged for generating a second divided control signal 226 based on division of the control signal by the third control signal. The second divided control signal is the second temperature indication 226. The system further optionally comprises a subtractor 230 arranged for generating a subtracted signal 235 based on subtracting the second divided control signal from the first divided control signal. Typically, the first divided control signal and the second divided control signal have distinct minimum temperature activities. The subtracted signal is the temperature indication.

The embodiment in FIG. 2 combined with the feature that the embodiment is arranged to resonate at two distinct resonance frequencies, selected such that the resonance frequencies have distinct activity dips, the first and second control signals, indicative for the first and second ratio respectively, would be suitable for measuring changes in temperature of the resonator, preferably a crystal resonator, as shown in FIG. 8. Distinct minimum temperature activities in the context of this application are minimums having their minimum frequency change at different or distinct temperatures. This minimum change may be relative to another the frequency of another signal. This embodiment provides the advantage of being able to measure temperature changes of the resonator over the whole temperature range with a high degree of accuracy. Another advantage is that the division of the first ratio with the second ratio provides a ratio independent of the first frequency. Thus, any temperature dependent variation of the first frequency may be eliminated.

Furthermore, the embodiment in FIG. 2 may be extended to comprise a third loop as shown in FIG. 7. The third loop comprises a 3-th controlled frequency divider 112, a 3-th phase detector 152 and a 3-th loop filter 162 all arranged in a similar way as for the first and second loop. Further, this embodiment is extended with a first control signal divider generating a first divided control signal by dividing the control signal by the second control signal. Further, this embodiment is extended with a second control signal divider generating a second divided control signal by dividing the control signal by the third control signal. Further, this embodiment is extended with a subtractor arranged for generating a subtracted signal based on subtracting the second divided control signal from the first divided control signal, wherein the subtracted signal is indicative of the temperature of the resonator, as shown in FIG. 9. Further, at least the first divided control signal and the second divided control signal have distinct minimum temperature activities.

This embodiment provides the advantage of being able to measure temperature changes of the resonator over the whole temperature range with a high degree of accuracy. Another advantage is that the divisions of the ratios provide divided ratios, which are independent of the first frequency. Thus, any temperature dependent variation of the first frequency may be eliminated or at least minimized. Furthermore, any behaviour of the resonator changing the resonance frequencies of the resonator, such as time dependent behaviour e.g. hysteresis, may be compensated.

The used frequency measurement technique allows measurement accuracy in the order of 0.1 ppb at a speed of 1 k samples/s. This translates to that the system is advantageously capable of measuring, with a stable first frequency, of small temperature changes of the resonator, such as crystal. Small temperature changes may be in the range of milli-Kelvin. Further, the system is typically capable to respond sufficiently fast to changes.

In an embodiment of the invention, an offset is added to the phase difference signal. This allows for letting the loop lock on a different angle. For example, if the frequency phase detector has a minimum output signal for 0-degrees phase shift on its inputs, the offset will cause the loop to lock at non-0-degrees. For example, if the frequency phase detector has a minimum output signal for 90-degrees phase shift on its inputs, the offset will cause the loop to lock at non-90-degrees.

In an embodiment, a resonator, such as a crystal oscillator, crystal or crystal resonator, may be used, which is indirectly read out. This indirectly reading out may introduce a phase shift. This introduced phase shift may be corrected for with the introduction of an offset as described above.

In a further embodiment, the circuit comprises a first input signal generator. As the first frequency of the first input signal is divided by the controlled frequency divider, the first frequency will be higher, preferably much higher than the divided frequency. A high frequency generator uses smaller inductors and/or capacitors. Thus, the combination of a first input signal generator and a controlled frequency divider advantageously allows miniaturization and further integration of the circuit. The circuit may even be integrated on a chip allowing for further reducing noise related issues with discrete electronic components and reduce cross talk between these components. Furthermore, the combination of the first input signal generator and the controlled frequency divider typically provides the advantage of lower phase noise compared to generating the divided signal directly.

An implementation of the first input signal generator may be a VCO, which is generating a first input signal having a first frequency which may be different from the second frequency of the second input signal. In case of a resonator, the first frequency may be different from any resonance mode of the resonator. The first frequency may be much higher, and even on a non-integer multiple of all modes.

This is distinct from the known methods of using some crystal as resonator and applying a series PLL to get to higher frequencies. This implementation provides the advantage of reducing component count and allowing further integration while allowing more flexibility.

A signal may be periodic signals. A periodic signal repeats itself after every period. The amount of repetitions per second equals the frequency. Furthermore, a signal may have a maximum magnitude, such as an amplitude or a value, an average signal level and an RMS level. A signal in the context of this text may be an analogue signal, such as a voltage signal, a current signal, a power signal and/or an energy signal. A signal in the context of this text may also be a digital signal representing a voltage signal, a current signal, a power signal and/or an energy signal. The frequency ratio is a frequency ratio signal.

A controlled frequency divider may be a digital controlled frequency divider. The controlled frequency divider may be a controlled multiple frequency divider. The controlled multiple frequency divider provides an output signal having an output frequency equal to an input frequency of an input signal divided by n, wherein n is a number of the collection N. In formula:

$$f_{out} = \frac{f_{in}}{x}; x \in \mathbb{N}^+$$

Alternatively, the controlled frequency divider may be a controlled fractional divider. In formula:

$$f_{out} = \frac{f_{in}}{x}; x \in \mathbb{Q}^+$$

in practical implementations, the controlled fractional frequency divider may be limited to for example:

$$f_{out} = \frac{f_{in}}{x}; x \in \mathbb{Z}^+$$

An exemplary embodiment of a digital controlled multiple frequency divider is, wherein the divider switches between a division number N and N+1. A prerequisite is that if the divided signal is fed to a resonator, this resonator has a decent quality Q. By switching between N and N+1, for instance fractional numbers such as N+3/4 or N+5/7 are possible.

The implementation of such a digital controlled multiple frequency divider may be done with the addition of an accumulator with a settable maximum value. In the example of N+3/4 an accumulator with a maximum capacity of 4 and a repeatedly added number of 3 will have a carry in 3 out of the 4 cycles. Each time the carry is present the divider should divide by the N+1 number, any other time the divider should divide by N. This technique may be typed as shaping.

Higher order shaping may be done by adding another accumulator and a small differentiator. As a result, for higher order shaping the digital controlled frequency divider may divide by either N−1, N, N+1 or N+2. Higher order shaping causes the spectral behaviour to show a steeper roll off causing less noise in the loop. Higher order shaping provides the circuit with the advantage of a more stable frequency ratio.

A DTC (Digital to Time Converter) may be used to shift the edge of a signal, such as the output of a digital controlled multiple frequency divider. The digital controlled multiple frequency divider divides N alternated in some pattern by division by N+1, while the DTC interpolates the edges to be on near perfect time. A DTC therefore may decrease the jitter introduced in the circuit providing the advantage of a more stable circuit and/or frequency ratio.

The two methods above, being a digital controlled multiple frequency divider and a DTC, have different performance in the sense of noise and accuracy. The digital controlled multiple frequency divider provides a divided signal wherein the loop stability and optionally accuracy rely on filtering rejection by the loop filter and if present on the resonator. On the other hand, the DTC provides much better initial accuracy, but has as a disadvantage that it adds a spectrally large noise component. Which advantage or disadvantage is dominant is not easily determined as the advantages and disadvantages vary with the behaviour of the other circuit components, specifically with the other circuit components in the loop, and the signals provided to the circuit.

The frequency phase detector may be a frequency mixer, analogue multiplier, digital circuit or logic circuit configured as phase detector. A frequency phase detector, phase detector or phase generates an output signal, such as a phase difference signal, which represents the difference in phase between two input signals, such as between a divided signal and a second input signal. Depending on the type of frequency phase detector, the input signals may need to be phase shifted to provide an output signal which may be used to lock on for the loop. As an example, a logic circuit phase detector, made from ex-OR logic gates, typically locks the loop at a 90° degree phase shift between the input signals.

The loop filter stabilizes the loop. The loop filter may further stabilize the loop in view of the input signals provided to the circuit. If a resonator is present, the loop filter may further stabilize the circuit taking into account the resonator behaviour. The loop filter may be a first or multiple order filter. The loop filter is typically a low-pass filter. The cut-off frequency of the loop-filter is typically a balance between accuracy and speed of correction of disturbances in the circuit. A lower cut-off frequency provides more accuracy as less jitter is allowed trough the loop filter, while a higher cut-off frequency provides a quicker response to changes in the circuit, such as temperature changes. Also, the loop lock behaviour of the circuit may be influenced by the loop filter, specifically the selection of the cut-off frequency. An important factor when designing a loop filter is to consider the loop gain. The loop filter is typically implemented as a PID controller.

A resonator has a fundamental frequency, which is the lowest frequency of resonance. Further, the resonator may resonate at harmonic frequencies, which adhere to the relation $$f_{harmonic} = f_{fundamental} * 2\pi x; x \in \mathbb{N}^+$$

Further, the resonator may resonate at an overtone frequency, which adheres to the relation $$f_{overtone} = f_{fundamental} * (2\pi x + y); x \in \mathbb{N}^+, 0 < y \ll 2\pi$$

Resonance frequencies of a crystal, a crystal oscillator or crystal resonator may be even or odd harmonics and the associated overtones. Typically, the odd harmonics and associated overtones are used for letting crystals resonate.

It should be noted that the figures are purely diagrammatic and not drawn to scale. In the figures, elements which correspond to elements already described may have the same reference numerals.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or stages other than those stated in a claim. The article "a" or "an" preceding an element does not exclude the presence of a plurality of such elements. The invention may be implemented by means of hardware comprising several distinct elements, and by means of a suitably programmed computer or processor. In the device claim enumerating several means, several of these means may be embodied by one and the same item of hardware. The mere fact that certain measures are recited in mutually different dependent claims does not indicate that a combination of these measures cannot be used to advantage.

Examples, embodiments or optional features, whether indicated as non-limiting or not, are not to be understood as limiting the invention as claimed.

The invention claimed is:

1. A circuit for determining a frequency ratio between a first input signal having a first frequency and a second input signal having a second frequency, wherein the circuit comprises:
    a controlled fractional frequency divider arranged for generating a divided signal having a divided frequency being substantially the first frequency divided by a control signal;
    a resonator arranged for being excited by an excitation signal having the divided frequency and is based on the divided signal, and generating the second input signal;
    a frequency phase detector arranged for generating a phase difference signal based on a frequency phase difference between the divided frequency of the divided signal and the second frequency of the second input signal; and
    a loop filter arranged for generating the control signal based on the phase difference signal;
        wherein a loop is formed by the controlled fractional frequency divider, the divided signal, the frequency phase detector, the phase difference signal, the loop filter and the control signal;
        wherein the loop filter filters the phase difference signal such that instability of the loop is prevented; and
        wherein the control signal is indicative of the frequency ratio(;) and
    wherein the circuit is arranged for determining a second frequency ratio between a third input signal having a third frequency and the second input signal having a fourth frequency, wherein the circuit further comprises:
        a second controlled fractional frequency divider arranged for generating a second divided signal having a second divided frequency being substantially the third frequency divided by a second control signal;
an adder arranged for generating an added signal supplied to the resonator, wherein the added signal is based upon adding the divided signal and the second divided signal;
a second frequency phase detector arranged for generating a second phase difference signal based on a second frequency phase difference between the second divided frequency of the second divided signal and the fourth frequency of the second input signal; and
a second loop filter arranged for generating the second control signal based on the second phase difference signal;
wherein a second loop is formed by the second controlled fractional frequency divider, the second divided signal, the second frequency phase detector, the second phase difference signal, the second loop filter and the second control signal;
wherein the second loop filter filters the second phase difference signal such that instability of the second loop is prevented; and
wherein the second control signal is indicative of the second frequency ratio.

2. The circuit according to claim 1, wherein the phase difference signal has a magnitude based on the frequency phase difference or the control signal has a magnitude indicative of the frequency ratio, and wherein the loop filter is a lowpass filter, having a cut-off frequency below the frequency noise introduced by the controlled fractional frequency divider and above a rate of change of the first and second frequencies.

3. The circuit according to claim 1, further comprising an analog to digital converter arranged for generating a digital second signal based on the second input signal, wherein the digital second signal is supplied to the frequency phase detector.

4. The circuit according to claim 1, further comprising a signal generator generating the first frequency, wherein the rate of frequency change is within the dynamic frequency tracking range of the loop.

5. The circuit according to claim 4, wherein the excitation signal is shifted in phase relative to the second input signal or is substantially in phase with the second input signal.

6. The circuit according to claim 5, wherein the resonator is a crystal resonator and the second frequency is an overtone resonance frequency of the crystal resonator.

7. The circuit according to claim 1, comprising a digital to analogue converter arranged for generating the excitation signal based on the divided signal, wherein the second frequency is a resonance frequency of the resonator.

8. The circuit according to claim 1, wherein the second phase difference signal has a second magnitude based on the second frequency phase difference, the second control signal has a magnitude indicative of the second frequency ratio; and wherein the second frequency and the fourth frequency are different.

9. The circuit according to claim 1, wherein the resonator is a crystal resonator and the fourth frequency is an overtone frequency of the crystal resonator.

10. The circuit according to claim 1, wherein the third input signal is the first input signal.

11. The circuit according to claim 1, wherein the circuit is arranged for determining a third frequency ratio between a fourth input signal having a fifth frequency and the second input signal having a sixth frequency, wherein the circuit comprises:
a third controlled fractional frequency divider arranged for generating a third divided signal having a third divided frequency being substantially the fifth frequency divided by a third control signal;
a third frequency phase detector arranged for generating a third phase difference signal based on a third frequency phase difference between the third divided frequency of the third divided signal and the sixth frequency of the second input signal; and
a third loop filter arranged for generating the third control signal based on the third phase difference signal;
wherein the added signal is further based upon adding the third divided signal;
wherein a third loop is formed by the third controlled fractional frequency divider, the third divided signal, the third frequency phase detector, the third phase difference signal, the third loop filter and the third control signal;
wherein the third loop filter filters the third phase difference signal such that instability of the third loop is prevented; and
wherein the third control signal is indicative of the third frequency ratio.

12. A system for determining a temperature indication of a resonator comprising the circuit according to claim 1, wherein the circuit comprising the resonator and further providing the control signal and the second control signal; and the system further comprising:—a control signal divider arranged for generating a divided control signal based on division of the control signal by the second control signal; wherein the divided control signal is the temperature indication.

13. The circuit according to claim 11, wherein the third phase difference signal has a third magnitude based on the third frequency phase difference or the third control signal has a magnitude indicative of the third frequency ratio.

14. The circuit according to claim 11,
wherein the second frequency and the fourth frequency are different;
wherein the second frequency and the sixth frequency are different;
wherein the fourth frequency and the sixth frequency are different; and
wherein the fourth input signal is the first input signal.

15. The circuit according to claim 11, wherein the resonator is a crystal resonator and the sixth frequency is an overtone frequency of the crystal resonator.

16. A system for determining a temperature indication of a resonator comprising the circuit according to claim 11,
wherein the circuit comprising the resonator and further providing the control signal, the second control signal and the third control signal; and the system further comprising:
a first control signal divider arranged for generating a first divided control signal based on division of the control signal by the second control signal;
a second control signal divider arranged for generating a second divided control signal based on division of the control signal by the third control signal; and
a subtractor arranged for generating a subtracted signal based on subtracting the second divided control signal from the first divided control signal;

wherein the first divided control signal and the second divided control signal have distinct minimum temperature activities; and wherein the subtracted signal is the temperature indication.

17. A method for determining a frequency ratio between a first input signal having a first frequency and a second input signal having a second frequency, wherein the method comprises the steps of:

generating a divided signal having a divided frequency being substantially the first frequency divided by a control signal;

generating an excitation signal having the divided frequency and being based on the divided signal;

generating the second input signal via a resonator being excited by the excitation signal;

generating a phase difference signal based on a frequency phase difference between the divided frequency of the divided signal and the second frequency of the second input signal; and generating the control signal based on filtering the phase difference signal;

wherein a loop is formed by the divided signal, the phase difference signal and the control signal;

wherein the filtering filters the phase difference signal such that instability of the loop is prevented; and wherein the control signal is indicative of the frequency ratio(;) and determining a second frequency ratio between a third input signal having a third frequency and the second input signal having a fourth frequency, wherein the method further comprises:

generating a second divided signal having a second divided frequency being substantially the third frequency divided by a second control signal;

generating an added signal supplied to the resonator, wherein the added signal is based upon adding the divided signal and the second divided signal;

generating a second phase difference signal based on a second frequency phase difference between the second divided frequency of the second divided signal and the fourth frequency of the second input signal; and generating the second control signal based on a second filtering, of the second phase difference signal;

wherein a second loop is formed by the second divided signal, the second phase difference signal, and the second control signal;

wherein the second filtering filters the second phase difference signal such that instability of the second loop is prevented; and wherein the second control signal is indicative of the second frequency ratio.

18. A method for determining a temperature indication of a resonator, wherein the method comprises the steps of:

generating a first divided signal having a first divided frequency being substantially a first frequency of a first input signal divided by a first control signal;

generating a second divided signal having a second divided frequency being substantially the first frequency of the first input signal divided by a second control signal;

generating an added signal supplied to the resonator, wherein the added signal is based upon adding the first divided signal and the second divided signal;

supplying the added signal to the resonator;

receiving a second input signal from the resonator, which second input signal comprises first and second frequencies, which are responses of the resonator to the first and second divided frequencies;

generating a first phase difference signal based on a first frequency phase difference between the first divided frequency of the first divided signal and the first frequency of the second input signal;

generating the first control signal based on filtering the first phase difference signal;

generating a second phase difference signal based on a second frequency phase difference between the second divided frequency of the second divided signal and the second frequency of the second input signal;

generating the second control signal based on filtering the second phase difference signal; and generating a divided control signal based on division of the first control signal by the second control signal;

wherein a first loop is formed by the first divided signal, the first phase difference signal and the first control signal;

wherein a second loop is formed by the second divided signal, the second phase difference signal and the second control signal;

wherein the filtering providing the first control signal filters the first phase difference signal such that instability of the first loop is prevented;

wherein the filtering providing the second control signal filters the second phase difference signal such that instability of the second loop is prevented;

wherein the first frequency of the second input signal and the second frequency of the second input signal have distinct minimum temperature activities; and wherein the divided control signal is the temperature indication.

19. A method for determining a hysteresis or temperature indication of a resonator, wherein the method comprises the steps of:

generating a first divided signal having a first divided frequency being substantially a first frequency of a first input signal divided by a first control signal;

generating a second divided signal having a second divided frequency being substantially the first frequency of the first input signal divided by a second control signal;

generating a third divided signal having a third divided frequency being substantially the first frequency of the first input signal divided by a third control signal;

generating an added signal supplied to the resonator, wherein the added signal is based upon adding the first divided signal, the second divided signal and the third divided signal;

supplying the added signal to the resonator;

receiving a second input signal from the resonator, which second input signal comprises first, second and third frequencies, which are responses of the resonator to the first, second and third divided frequencies;

generating a first phase difference signal based on a first frequency phase difference between the first divided frequency of the first divided signal and the first frequency of the second input signal;

generating the first control signal based on filtering the first phase difference signal;

generating a second phase difference signal based on a second frequency phase difference between the second divided frequency of the second divided signal and the second frequency of the second input signal;

generating the second control signal based on filtering the second phase difference signal;

generating a third phase difference signal based on a third frequency phase difference between the third divided frequency of the third divided signal and the third frequency of the second input signal;

generating the third control signal based on filtering the third phase difference signal;

generating a first divided control signal based on division of the first control signal by the second control signal;

generating a second divided control signal based on division of the first control signal by the third control signal; and generating a subtracted signal based on subtracting the second divided control signal from the first divided control signal;

wherein a first loop is formed by the first divided signal, the first phase difference signal and the first control signal;

wherein a second loop is formed by the second divided signal, the second phase difference signal and the second control signal;

wherein a third loop is formed by the third divided signal, the third phase difference signal, and the third control signal;

wherein the filtering providing the first control signal filters the first phase difference signal such that instability of the first loop is prevented;

wherein the filtering providing the second control signal filters the second phase difference signal such that instability of the second loop is prevented;

wherein the filtering providing the third control signal filters the third phase difference signal such that instability of the third loop is prevented;

wherein the first frequency of the second input signal and the second frequency of the second input signal and the third frequency of the second input signal have relative to each other distinct minimum temperature activities; and wherein the subtracted signal is the hysteresis or temperature indication.

* * * * *